US007582920B2

(12) United States Patent
Itzler et al.

(10) Patent No.: US 7,582,920 B2
(45) Date of Patent: Sep. 1, 2009

(54) APPARATUS COMPRISING AN AVALANCHE PHOTODIODE

(75) Inventors: Mark Allen Itzler, Princeton, NJ (US); Rafael Ben-Michael, Scotch Plains, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 0 days.

(21) Appl. No.: 12/051,651

(22) Filed: Mar. 19, 2008

(65) Prior Publication Data

US 2008/0164555 A1 Jul. 10, 2008

Related U.S. Application Data

(63) Continuation of application No. 11/251,965, filed on Oct. 17, 2005, now Pat. No. 7,378,689.

(51) Int. Cl.
*H01L 21/00* (2006.01)
(52) U.S. Cl. .......................... 257/186; 257/438; 438/48
(58) Field of Classification Search ................ 257/186, 257/438; 438/48
See application file for complete search history.

(56) References Cited

U.S. PATENT DOCUMENTS

| 4,634,474 | A | * | 1/1987 | Camlibel et al. | ............ 438/569 |
| 5,500,376 | A | * | 3/1996 | Ishaque et al. | ................ 438/73 |
| 5,998,837 | A | * | 12/1999 | Williams | .................... 257/341 |
| 6,515,315 | B1 | * | 2/2003 | Itzler et al. | .................. 257/186 |
| 6,583,482 | B2 | * | 6/2003 | Pauchard et al. | ............ 257/438 |
| 6,720,588 | B2 | * | 4/2004 | Vickers | ...................... 257/186 |
| 6,797,581 | B2 | * | 9/2004 | Vickers | ...................... 438/380 |
| 2002/0185695 | A1 | * | 12/2002 | Beasom | ...................... 257/402 |
| 2003/0047752 | A1 | * | 3/2003 | Campbell et al. | ........... 257/186 |
| 2006/0084187 | A1 | * | 4/2006 | Francis et al. | .................. 438/1 |
| 2006/0121683 | A1 | * | 6/2006 | Francis et al. | ............... 438/380 |

OTHER PUBLICATIONS

Office Action from U.S. Appl. No. 11/251,965 dated May 1, 2007.
Office Action from U.S. Appl. No. 11/251,965 dated Jun. 29, 2007.
Final Office Action from U.S. Appl. No. 11/251,965 dated Oct. 30, 2007.
Campbell et al., "Frequency Response of InP/InGaAsP/InGaAs Avalanche Photodiodes with Separate Absorption 'Grading' and Multiplication Regions", "IEEE Journal of Quantum Electronics", Nov. 11, 1985, pp. 17431746, vol. QE-21, No. 11, Publisher: IEEE, Published in: US.
Y. Liu et al., "A Planar InP/InGaAs Avalanche Photodiode with Floating Guard Ring and Double Diffused Junction", "Journal of Lightwave Technology", Feb. 2, 1992, pp. 182-193, vol. 10, No. 2, Published in: US.
Menz, Douglas M., "U.S. Appl. No. 11/251,965 Notice of Allowance", Feb. 5, 2008, Publisher: USPTO, Published in: US.

* cited by examiner

*Primary Examiner*—Douglas M Menz
(74) *Attorney, Agent, or Firm*—DeMont & Breyer, LLC

(57) ABSTRACT

Avalanche photodiodes are provided, wherein the APDs provide both high optical coupling efficiency and low dark count rate. The APDs are formed such that their cap layer has an active region of sufficient width to enable high optical coupling efficiency but the APD still exhibits a low dark count rate. These cap layers have a device area with an active region and an edge region, wherein the size of the active region is substantially matched to the mode-field diameter of an optical beam, and wherein the size of the edge region is made small so as to reduce the number of defects included. These APD designs maintain a substantially uniform gain and breakdown voltage, as necessary for practical use.

20 Claims, 8 Drawing Sheets

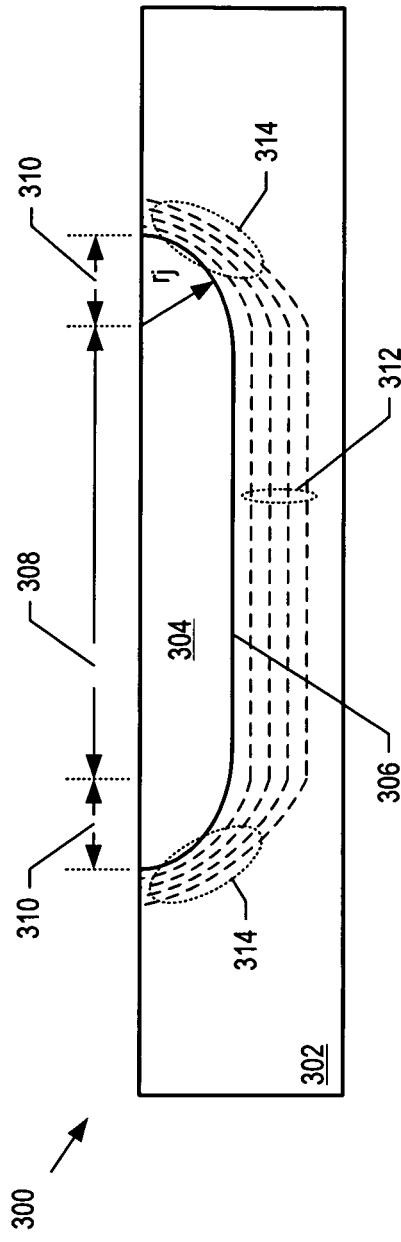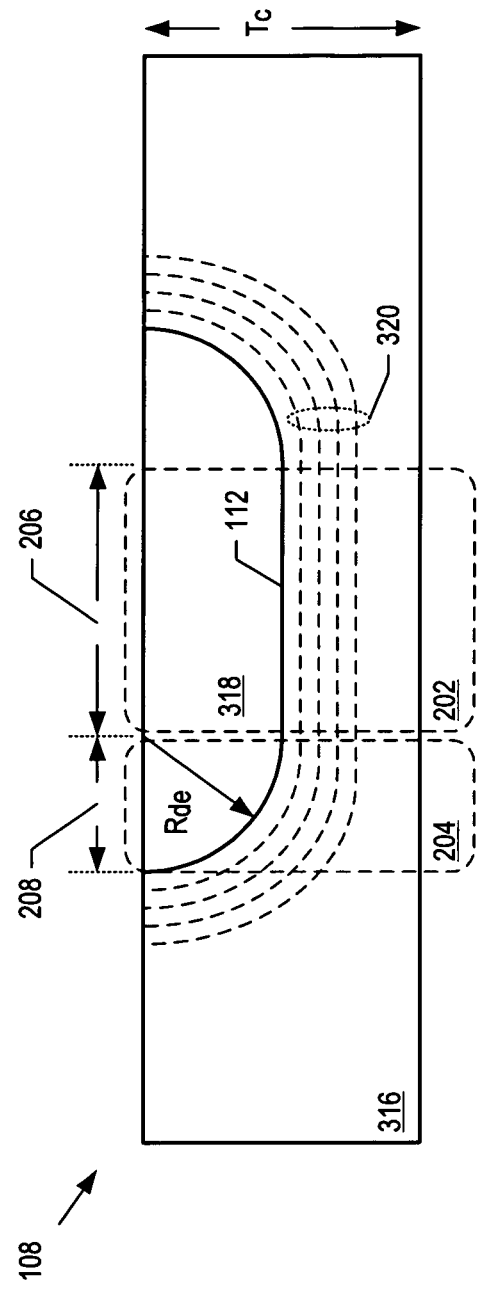
Figure 3A (Prior Art)
Figure 3B

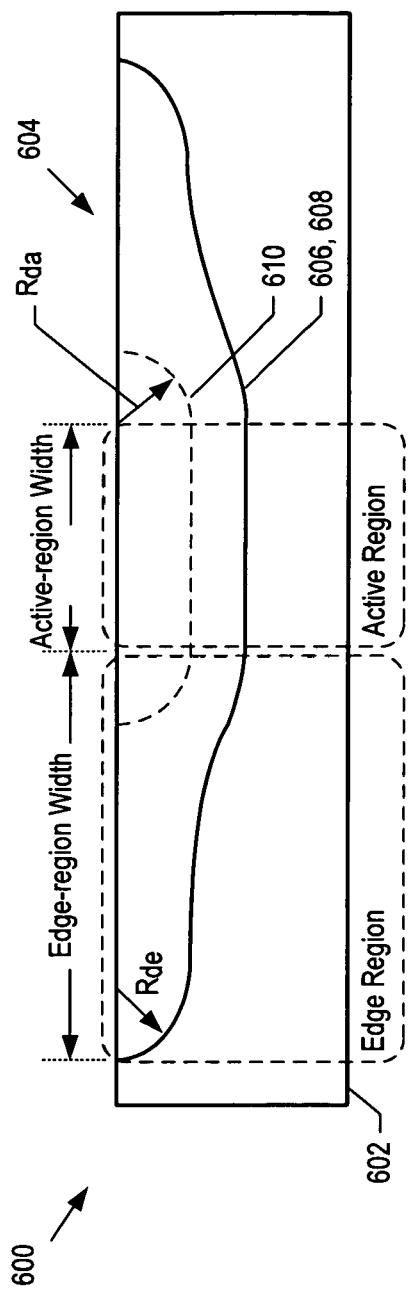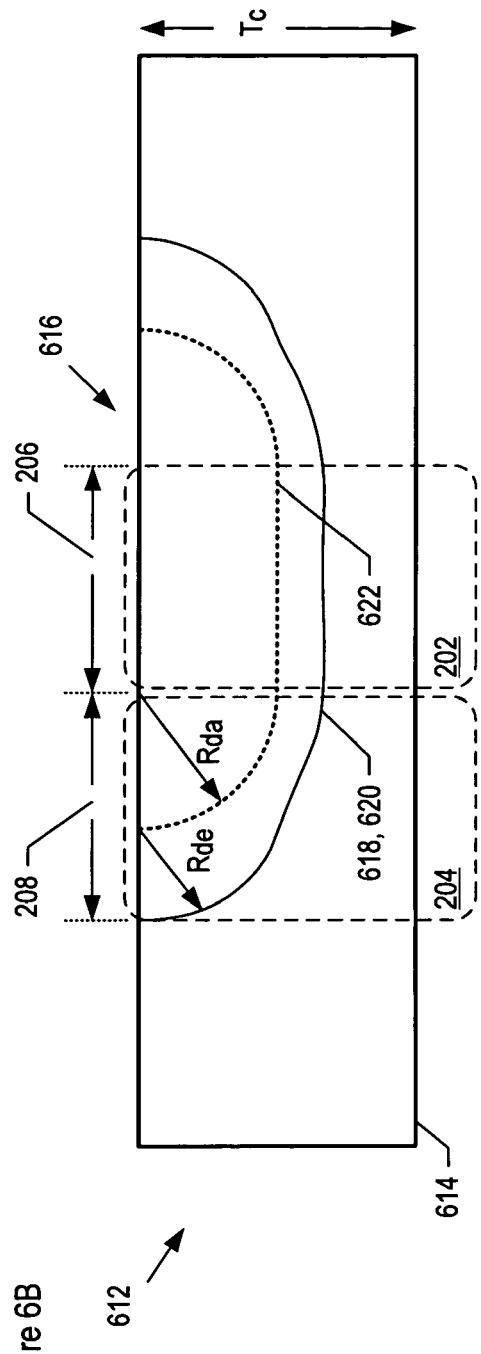

APPARATUS COMPRISING AN AVALANCHE PHOTODIODE

STATEMENT OF RELATED CASES

This case is a continuation of co-pending U.S. patent application Ser. No. 11/251,965 filed 17 Oct. 2005, which is incorporated by reference herein.

FIELD OF THE INVENTION

The present invention relates to avalanche photodiodes in general and, more particularly, to avalanche photodiodes for use in single-photon detection applications.

BACKGROUND OF THE INVENTION

Avalanche photodiode (APD) structures that have separate absorption and multiplication layers (SAM-APDs) can provide electrical output signals with high fidelity (i.e., low noise). In a SAM-APD, the optical energy is absorbed and converted into electrical carriers in a layer specifically designed for efficient absorption (hereinafter, referred to as the "absorption layer"). The resulting electrical signal is amplified in a different layer specifically designed for efficient electrical carrier multiplication (hereinafter, referred to as the "cap layer"). By separating the absorption and multiplication functions into different semiconductor layers, each can be independently optimized for its intended purpose.

A device region can be formed in the cap layer of a SAM-APD by diffusion of a dopant into the semiconductor layer to form a p-n junction. The undoped portion of the cap layer that resides beneath the p-n junction provides a high-field region in which avalanche multiplication can occur (i.e., the avalanche multiplication region).

The principal driver for improved APD performance has been its use in telecommunications systems. For these applications, the APD is electrically biased such that the electrical response is substantially linear with optical power. Recently, interest has arisen in the use of APDs for detection of single photons in such applications as cryptography. For single-photon-detection applications, the APD is electrically biased at or beyond its "electrical breakdown voltage." The breakdown voltage is the voltage at which the p-n junction is sufficiently reverse-biased to conduct a large current arising from a self-sustaining avalanche process—even in the absence of continuous optical power. An APD that is biased at or above breakdown, therefore, can give rise to an easily detectable pulse of electrical current in response to the absorption of even a single photon.

Two important parameters for an APD are the uniformity of the gain and breakdown voltage across the device region. Gain and breakdown voltage are functions of the thickness of the undoped portion of the device region. Dopant diffusion in a semiconductor is a substantially isotropic process (i.e., the dopant diffuses laterally and vertically, at nearly the same rate). As a result, it is well understood that a diffused p-n junction will have a central portion (hereinafter, referred to as the "active region") and an outer portion (hereinafter, referred to as the "edge region").

The active region is characterized by a uniform, planar junction profile while the edge region has a non-uniform, curved junction profile. In the active region, the uniform junction profile leads to uniform gain and uniform breakdown voltage. The curvature of the junction profile in the edge region, however, leads to a larger local electric field and therefore higher gain and lower breakdown voltage than in the active region. This undesirable phenomenon is typically referred to as "edge breakdown". For practical SAM-APDs, the breakdown-voltage uniformity across the entire device region should be within 10%, and preferably within 1%.

Another important performance metric for an APD, particularly in a single-photon detection application, is Noise Equivalent Power (NEP). NEP is a function of the ratio of erroneous signals (referred to as the dark count rate) to optical detection efficiency. A photodiode with low NEP will contribute few false counts while still detecting most or all of the received photons.

A low NEP can be achieved by 1) high detection efficiency and/or 2) low dark count rate. Detection efficiency is a function of several factors: (i) the amount of the light signal which is directed into the detector (i.e., optical coupling efficiency); (ii) the probability that a received photon is absorbed by the detector (i.e., quantum efficiency); and (iii) the probability that the absorbed photon will result in a detectable avalanche event (i.e., avalanche probability).

A high coupling efficiency can be achieved by making the device region of an APD at least as large as the mode-field diameter of the optical beam. Many prior art photodiodes, in fact, have a device region that is larger than the mode-field diameter so as to both capture as much of the light as possible and allow for some misalignment while still capturing the entire beam.

Avalanche probability can be improved by increasing the bias voltage so that it is well above the breakdown voltage. The larger this overbias, the greater the probability that a received photon will generate an avalanche event. Unfortunately, dark count rate also increases with overbias; therefore in many cases increased overbias actually degrades NEP rather than improves it.

Device technologists in the communications field have long understood that device performance and manufacturing yield of semiconductor devices are functions of material quality. In the past few decades, therefore, effort has been directed toward improving crystal growth techniques so as to reduce semiconductor material defect density. Improved crystal growth techniques can also reduce the presence of defects that serve as nucleation sites for dark current mechanisms. However, radical improvements in the overall materials growth technology area would be required to affect any significant reduction of dark count rate. Moreover, it is unlikely that defects will ever be completely eliminated through improved growth technique in a cost-effective manner.

It is desirable, therefore, to develop an avalanche photodiode with improved NEP in a manner that is compatible with conventional crystal growth techniques and overcomes some of the costs and limitations of the prior art.

SUMMARY OF THE INVENTION

The present invention is an avalanche photodiode having separate multiplication and absorption layers (SAM-APDs). In some embodiments, the avalanche photodiode provides high optical coupling efficiency and low dark count rate. Some embodiments of the present invention are particularly useful for single-photon detection applications.

An embodiment in accordance with the present invention provides an APD that incorporates:
  an active region of sufficient width for high coupling efficiency with an optical beam; and
  an edge region, wherein the width of the edge region is substantially minimized, and wherein gain and breakdown voltage in the edge region are within approximately 10% of the gain and breakdown voltage, respectively, in the active region.

An aspect of the present invention is the inventors' recognition that the dark count rate is a function of the number of defects located in the device region of an APD, and that the dark count rate can be decreased by reducing the volume of the device region. In some embodiments, the total volume of the device region is reduced by decreasing the width of the edge region. APDs of these embodiments still maintain a uniform gain profile or a uniform breakdown voltage profile across the device region.

A further aspect of the present invention is the recognition that the curvature of the junction profile in the edge region (and therefore the gain and breakdown voltage in the edge region) is affected by the ratio of certain parameters of the APD, as follows:
- edge-region width to active region width;
- edge-region width to the diffusion radius of the dopants in the edge region;
- edge-region width to cap layer thickness.

Some embodiments of APDs described herein fall within a desired range of the foregoing ratios. Such APDs operate with low NEP while maintaining a uniform gain profile or uniform breakdown voltage across the device region.

BRIEF DESCRIPTION OF THE DRAWINGS

FIG. 3A depicts a cross-sectional view of a cap layer of a SAM-APD, formed using a single dopant diffusion, according to the prior art.

FIG. 3B depicts a cross-sectional view of a cap layer of a SAM-APD, formed using a single dopant diffusion, according to an embodiment of the present invention.

FIG. 6A depicts a cross-sectional view of a cap layer of a SAM-APD, formed with a double diffusion, according to the prior art.

FIG. 6B depicts a cross-sectional view of a cap layer of a SAM-APD, formed with a double diffusion, according to an embodiment of the present invention.

DETAILED DESCRIPTION

The following terms are defined for use in this Specification, including the appended claims:

Device region is the portion of the cap layer defined by the lateral extent of the doped portion of the cap layer. The device region includes the full thickness of the cap layer, and therefore includes the undoped portion of the cap layer that resides under the doped portion. For example, the device region includes both the active region and the edge region, as defined below.

Active region means that portion of the cap layer wherein the p-n junction has a substantially uniform doping profile and junction depth (i.e., wherein the p-n junction is a planar junction). The active region extends though the entire thickness of the cap layer, and therefore also includes the avalanche multiplication region under the planar junction.

Edge region means that portion of the cap layer wherein the p-n junction does not have a substantially uniform doping profile and junction depth (i.e., wherein the p-n junction is spherical or cylindrical). The edge region extends through the entire thickness of the cap layer. In APD designs that include guard rings, the edge region includes those areas of the cap layer that are doped to form the guard ring structures.

In the case of a single-photon detector, a low NEP is of particular importance. A photodiode with low NEP contributes few false signals while still detecting many or most received photons. As described in the Background section, a low NEP can be achieved by 1) high detection efficiency, and/or 2) low dark count rate.

In some APD applications, particularly single-photon detection, the desire for high detection efficiency and low dark count rate leads to a conflict in design methodology. In order to achieve high detection efficiency, it is desirable that the device region of the APD is large so as to couple all of the energy contained in the mode-field diameter of the optical beam being detected. On the other hand, the dark count rate is proportional to the size of the device region, and therefore it is desirable to make the device area small.

The present inventors recognized that for any given defect density, the number of defects is directly proportional to the volume of the device region. As a result, the number of defects, and therefore the dark count rate, decreases with the volume of the device region. As described in detail below, APDs in accordance with the illustrative embodiment have a reduced device-region volume. This is accomplished by reducing the width of the edge region, while avoiding premature edge breakdown.

Figure 1:
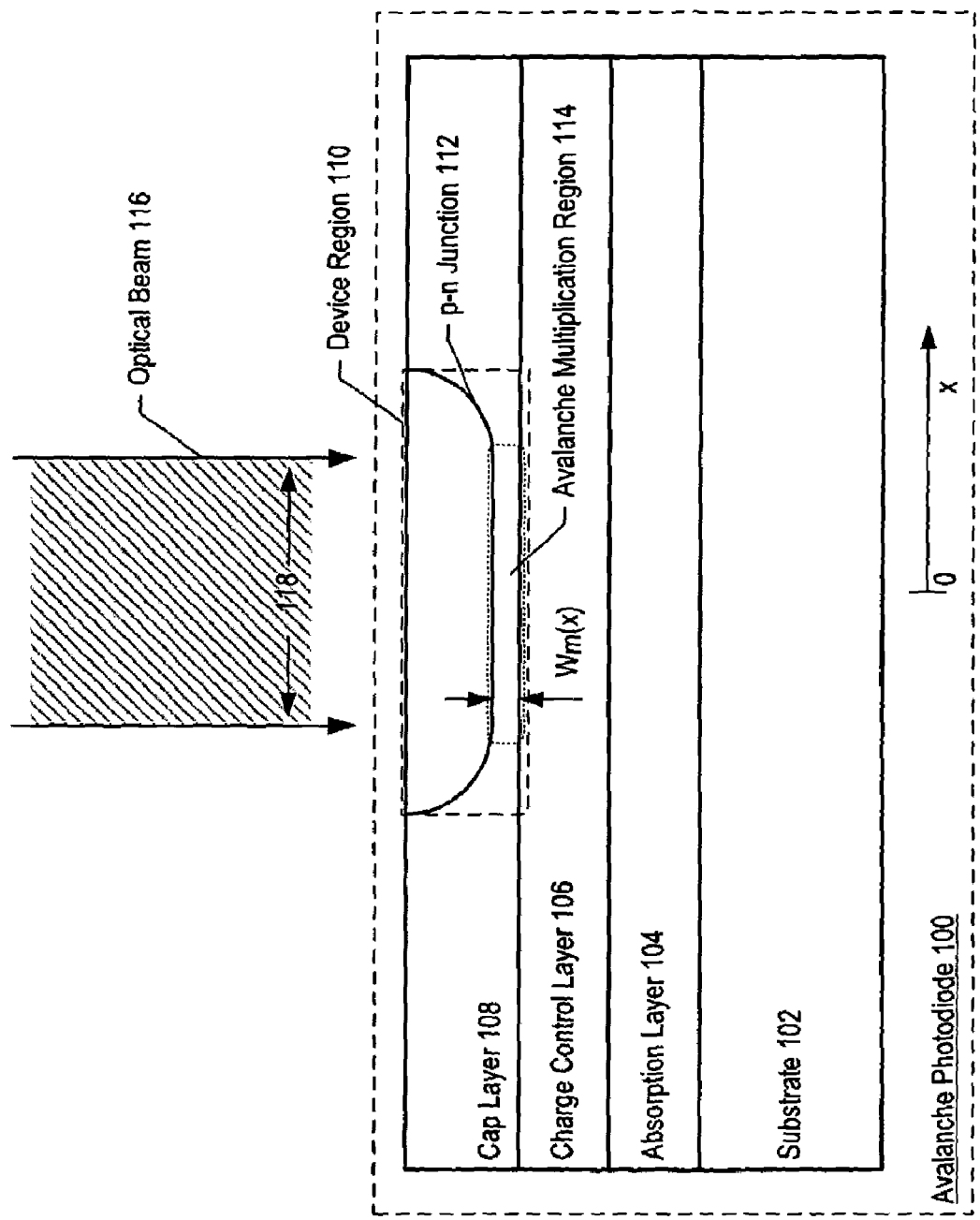
FIG. 1 depicts a SAM avalanche photodiode in communication with an optical beam according to an embodiment of the present invention.

FIG. 1 depicts a SAM avalanche photodiode receiving an optical beam according to an embodiment of the present invention. Photodiode 100 comprises substrate 102, absorption layer 104, charge control layer 106, and cap layer 108.

Absorption layer 104 absorbs the optical energy of optical beam 116, as contained within mode-field diameter 118, and generates electrical carriers. Absorption layer 104 is an intrinsic layer of indium gallium arsenide. It will be clear to those skilled in the art how to make and use absorption layer 104.

Charge control layer 106 is a moderately n-doped layer of indium phosphide. Charge control layer 106 enables maintenance of a low electric field in absorption layer 104, while supporting a high electric field in cap layer 108. It will be clear to those skilled in the art how to make and use charge control layer 106.

Cap layer 108 is a lightly n-doped layer of indium phosphide. As used herein, the terms "lightly n-doped" and "lightly p-doped" refer to the intentional doping of a semiconductor layer with an n-type or p-type dopant to a dopant concentration of less than three orders of magnitude greater than the background concentration of the semiconductor layer. Within cap layer 108 is device region 110 which includes a heavily doped p-type region. Device region 110 is formed by diffusing a p-type dopant into cap layer 108 to form p-n junction 112. The lateral extent of p-n junction 112 defines the lateral extent of device region 110. The undoped portion of device region 110 (i.e., the region beneath p-n junction 112) forms avalanche multiplication region 114, which is a high-field multiplication region of thickness $W_m(x)$ in which avalanche multiplication occurs.

Depending upon device design considerations, $W_m(0)$, wherein x=0 is the center of the active region, is a value in the range from 2% to 50% of the thickness of cap layer 108. In some embodiments, $W_m(0)$ is a value between 10-25% of the thickness of cap layer 108. In some embodiments, $W_m(0)$ is approximately 20% of the thickness of cap layer 108.

In some embodiments, cap layer 108 is a lightly p-doped layer of indium phosphide and device region 110 is heavily doped with an n-type dopant. In some other embodiments, cap layer 108 is an intrinsic layer of III-V semiconductor material. It will be clear to those skilled in the art, after reading this specification, how to make and use embodiments of the present invention in which cap layer 108 is other than a lightly n-doped layer of indium phosphide.

Figure 2A:
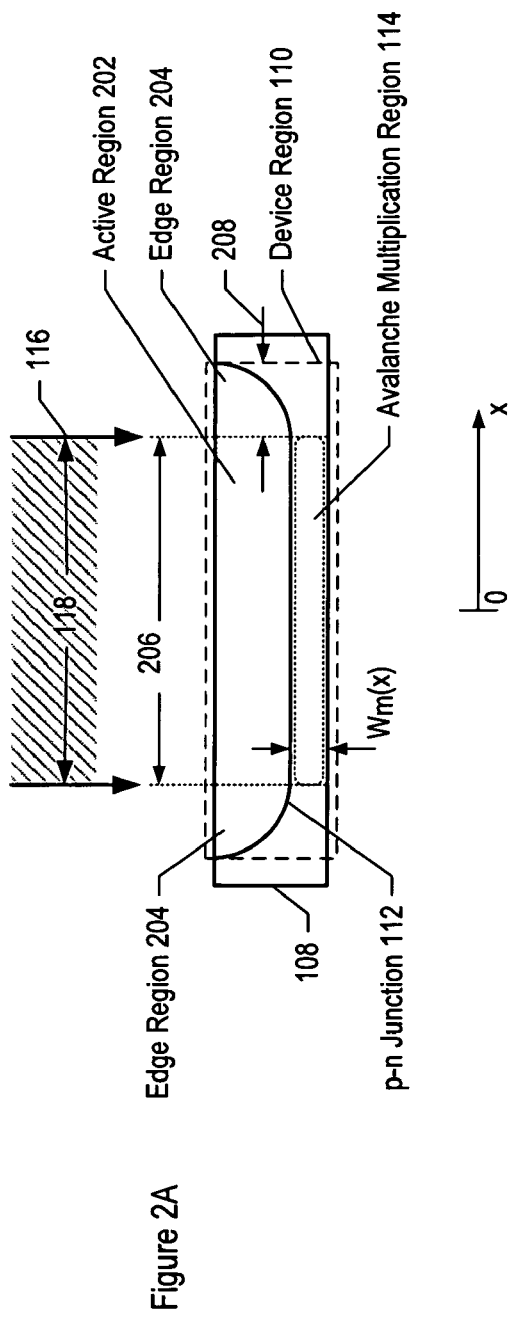
FIG. 2A depicts a cross-sectional view of an optical beam coupled to the cap layer of a SAM-APD according to an embodiment of the present invention.
Figure 2B:
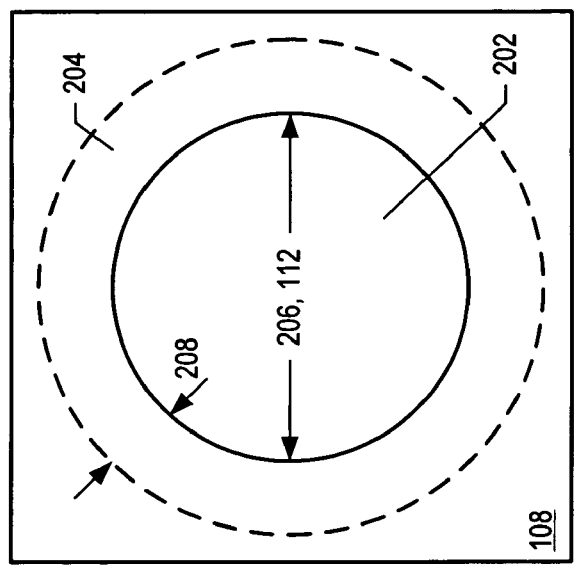
FIG. 2B depicts a top view of an optical beam coupled to the cap layer of a SAM-APD according to an embodiment of the present invention.

FIGS. 2A and 2B depict a cross-sectional view and top view, respectively, of an optical beam coupled to the cap layer of a SAM-APD according to an embodiment of the present invention. Cap layer 108 comprises device region 110, which is defined laterally by the extent of p-n junction 112. Device region 110 comprises active region 202, having active-region width 206, and edge region 204, having edge-region width 208.

Active region 202 is the central portion of device region 110 wherein p-n junction 112 is at a uniform depth (i.e., where p-n junction 112 is a plane junction). The value of $W_m(x)$ is substantially equal to $W_m(0)$ across active-region width 206. In some embodiments, active-region width 206 is substantially equal to mode-field diameter 118 of optical beam 116. In some other embodiments, active-region width 206 is made larger than mode-field diameter 118 in order to facilitate optical coupling to optical beam 116.

Edge region 204 is the outer region of device region 110, wherein p-n junction 112 is non-planar. Edge region 204 is formed by the lateral diffusion of the dopant used to form p-n junction 112, as will be described below and with respect to FIGS. 5A through 5C. In edge region 204, the value of $W_m(x)$ and the profile of p-n junction 112 vary with x. In some embodiments, p-n junction 112 forms a quasi-cylindrical junction in edge region 204. In some embodiments, p-n junction 112 forms a quasi-spherical junction in edge region 204.

In the embodiment of the present invention depicted in FIGS. 2A and 2B, active region 202 is a circular region surrounded by annular edge region 204. In some alternative embodiments, active region 202 is non-circular. In embodiments wherein active region 202 is non-circular, edge region 204 takes the form of a larger annulus of substantially the same outline with substantially uniform width.

FIG. 3A depicts a cross-sectional view of a cap layer of a SAM-APD, formed using a single dopant diffusion, according to the prior art. Cap layer 300 comprises semiconductor layer 302 and doped region 304.

Doped region 304 is a heavily p-doped region within n-doped semiconductor layer 302, and forms p-n junction 306. Doped region 304 includes a planar junction region (i.e., an active region) having active-region width 308, and a cylindrical junction region (i.e., an edge region) having edge-region width 310. The junction depth of p-n junction 306 in the active region is approximately equal to diffusion radius $r_j$.

Active region width 308 is much larger than edge-region width 310 and is also much larger than diffusion radius $r_j$.

Avalanche gain, breakdown field, and breakdown voltage are all substantially uniform in the planar junction region, as denoted by the uniform space between equipotential electric field lines 312 in this region. The cylindrical junction nature of the edge region, however, gives rise to the well-known junction curvature effect. The junction curvature effect leads to a higher electric field intensity and lower breakdown voltage in the edge region (commonly referred to as "edge breakdown"), as denoted by the crowding of equipotential field lines 312 in regions 314. The effect of junction curvature on breakdown voltage is derived from Poisson's equation as:

$$V_e = \frac{V_a}{2}(\eta^2 + 2\eta^{6/7})\ln(1 + 2\eta^{-8/7}) - \eta^{6/7} \qquad [1]$$

where:
$V_e$ is the edge-region breakdown voltage;
$V_a$ is the active-region breakdown voltage; and
$\eta$ is a function of the radius of curvature of the junction in the edge region, $r_j$.

A number of approaches for limiting edge breakdown are known in the prior art. These include: 1) adding guard rings outside the junction area to control the doping density at the junction edges; 2) adding a shaped charge control layer underneath the cap layer to enhance the electric field in the active region; and 3) forming a multi-tiered doping profile to reduce the curvature (and therefore the induced local electric field) of the junction profile at the edge of the device region. Common to all these approaches is an enlarged device region and/or more complicated device fabrication, which can lead to lower device yield, higher device cost, and lower device reliability.

An aspect of the present invention is the recognition that the curvature of the junction profile in the edge region is affected by several factors:
  i. edge-region width with respect to active region width; or
  ii. edge-region width with respect to the diffusion radius of the dopants in the edge region; or
  iii. edge-region width with respect to cap layer thickness; or
  iv. any combination of i, ii, and iii.

As discussed earlier, the curvature of the junction profile affects the intensity of the electric field in the edge region, and, as a result, the edge-region breakdown voltage. The present invention, therefore, provides APD structures with specific relationships between:
  a. the active-region width and the edge-region width; or
  b. the diffusion radius of the dopant in the active region and edge-region width; or
  c. the active-region width and the thickness of the cap layer; or
  d. the edge-region width and the diffusion radii of the dopants in the active and edge regions; or
  e. the edge-region width and the thickness of the cap layer; or
  f. any combination of a, b, c, d, and e.

In some applications, the mode-field diameter of the optical beam to which the APD is to be coupled may be small. In many of these applications, the required active-region width could be small enough that the device region could be formed using a single dopant diffusion while still avoiding premature edge breakdown. The present invention, therefore, provides for APDs with device regions formed using a single diffusion.

In other applications, the mode-field diameter of the optical beam to which the APD is to be coupled is larger. In these cases, a larger active region is required for efficient optical coupling. In the prior art, multiple diffusions (typically, two) have been used to form larger active regions. The relative sizes of the multiple diffusion regions have been determined, however, on the basis of avoidance of edge breakdown and without regard to the size of the device region as a whole. Therefore, optical coupling efficiency has been pursued without concern for dark count rate. In the present invention, the width of the edge region with respect to other design parameters is carefully considered as one of the relationships outlined above. The relative importance of each of these relationships, however, can differ between the single-diffusion case and multiple diffusion case. Therefore, the single-diffusion case and multiple diffusion case are addressed separately below.

Formation of a Cap Layer Using a Single Diffusion

FIG. 3B depicts a cross-sectional view of a cap layer of a SAM-APD, formed using a single dopant diffusion, according to an embodiment of the present invention. Cap layer 108 comprises semiconductor layer 316 and doped region 318.

Semiconductor layer 316 is a lightly n-doped layer of indium phosphide having a layer thickness of $T_c$.

Doped region 318 is a heavily p-doped region within semiconductor layer 316, which forms p-n junction 112. P-n junction 112 includes a planar junction region (i.e., active region 202) having active-region width 206 and a cylindrical junction region (i.e., edge region 204) having edge-region width 208.

In some embodiments, semiconductor layer 316 is an intrinsic semiconductor layer. In these embodiments, doped region 318 is doped with either an n-type dopant or a p-type dopant. In some embodiments, semiconductor layer 316 is a lightly p-doped semiconductor and doped region 318 is doped with an n-type dopant.

As will be described below and with respect to FIGS. 4 and 5A-C, doped region 318 is formed by diffusing a single p-type dopant into semiconductor layer 316 using a single diffusion process. The p-type dopant diffuses into semiconductor layer 316 to a diffusion radius of approximately $R_{de}$. In active region 202, the junction profile is planar and the junction depth of doped region 318 is substantially equal to $R_{de}$. In edge region 204, the junction profile is that of a cylindrical junction having a radius of curvature of approximately $R_{de}$.

It will be recognized by those skilled in the art that the lateral diffusion rate of a dopant in a semiconductor sometimes differs from the vertical diffusion rate. As a result, the junction depth may differ slightly from $R_{de}$, even in the case of a single diffusion of a single dopant. For the purposes of this specification, however, a slight difference in lateral and vertical diffusion rates is neglected, since it is not pertinent to the scope of the invention.

In some embodiments, multiple p-type dopants are diffused into semiconductor layer 316 in a single process.

The local values of gain and breakdown voltage are functions of the localized electric field and, therefore, are affected by the relationship between active-region width 206 and edge-region width 208. In the case of an APD formed by a single diffusion, the crowding of equipotential lines 320 becomes excessive as active region width 206 is made larger than twice the diffusion radius, $R_{de}$ (for example, cap layer 302 of FIG. 3A). The resultant reduction in breakdown voltage, therefore, also becomes excessive and the APD ceases to function properly. It is recognized as an aspect of the present invention, that sufficient uniformity of breakdown voltage is achieved for an APD with active-region width 206 in the range of approximately $0.5R_{de}$ to approximately $2R_{de}$. In some embodiments, active region width is substantially equal to $R_{de}$. Alternatively, since edge-region width 208 is approximately equal to $R_{de}$, active-region width 206 can be expressed as a function of edge-region width 208, wherein active-region width 206 is in the range of approximately 0.5 to 2 times edge-region width 208.

Diffusion radius $R_{de}$ (and, therefore, the junction depth in active region 202) is chosen to provide a suitable avalanche gain in active region 202. In some embodiments, $R_{de}$ is in the range of $0.5T_c$ to $0.98T_c$. In some embodiments, $R_{de}$ is in the range of $0.75T_c$ to $0.9T_c$. In some embodiments, $R_{de}$ is approximately $0.8T_c$. Alternatively, since $R_{de}$ can be expressed as a function of $T_c$, active-region width 206 can be expressed as a function of $T_c$, wherein active-region width 206 is in the range of approximately $0.25T_c$ to approximately $2T_c$.

Figure 4:
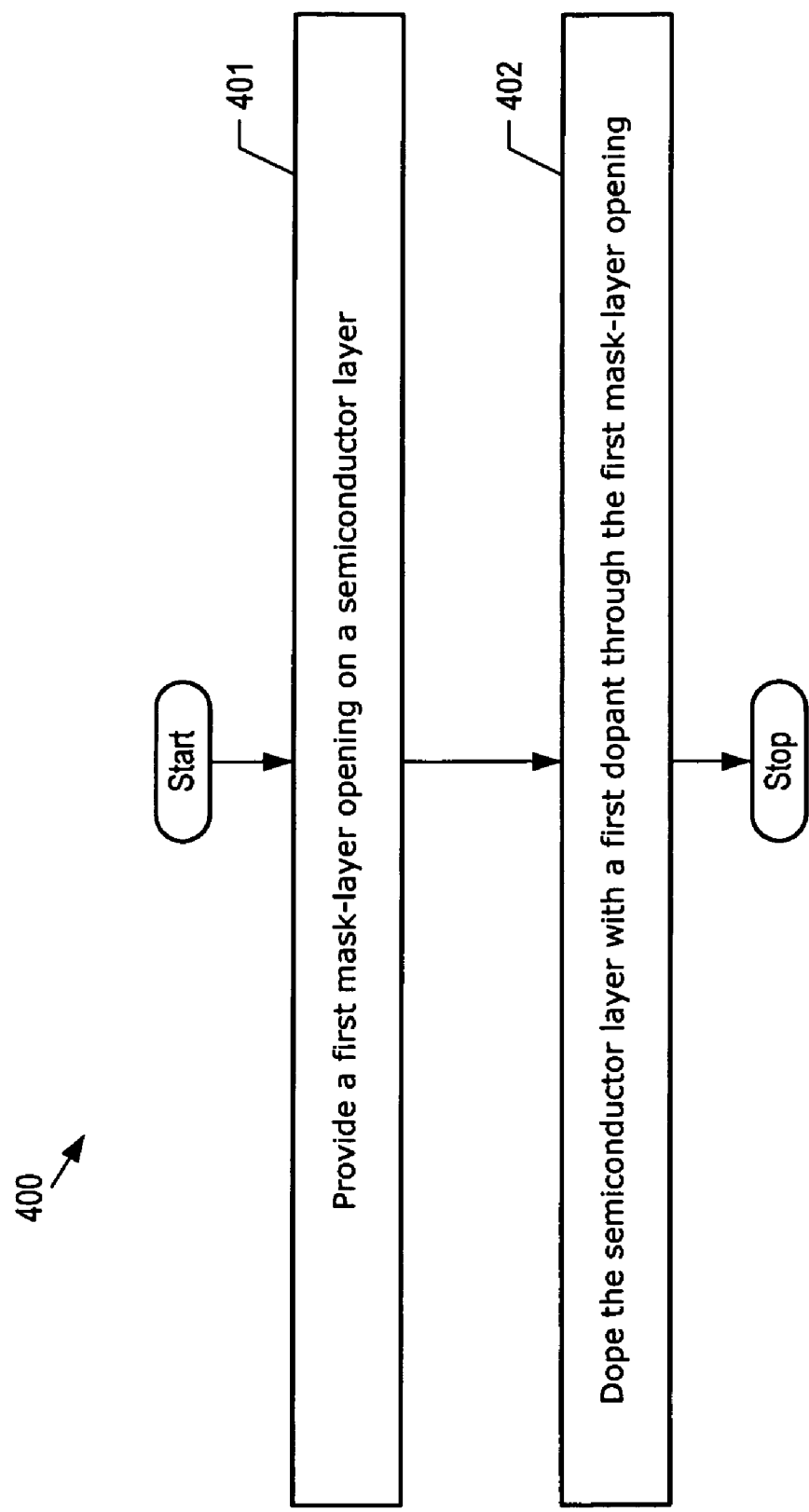
FIG. 4 depicts the salient components of a single diffusion method for fabricating the cap layer of a SAM-APD in accordance with an embodiment of the present invention.

FIG. 4 depicts the salient components of a single diffusion method for fabricating the cap layer of a SAM-APD in accordance with an embodiment of the present invention. In some embodiments, method 400 is used to form cap layer 108 shown in FIG. 3B.

Figure 5A:
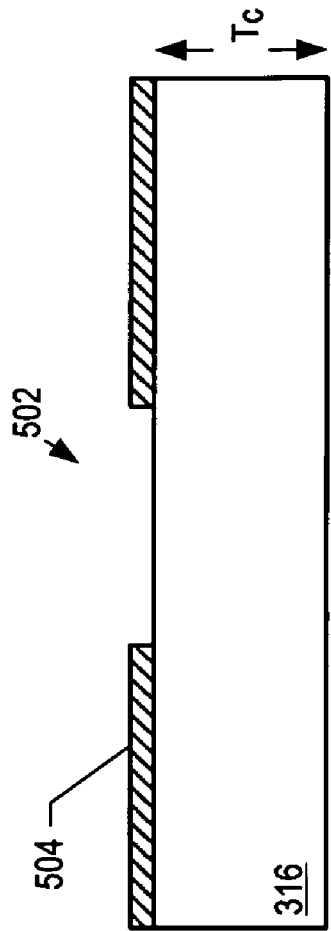
FIGS. 5A through 5C depict cross-sectional views of a cap layer during proceeding stages of fabrication, as fabricated in accordance with the operations depicted in FIG. 4.
Figure 5B:
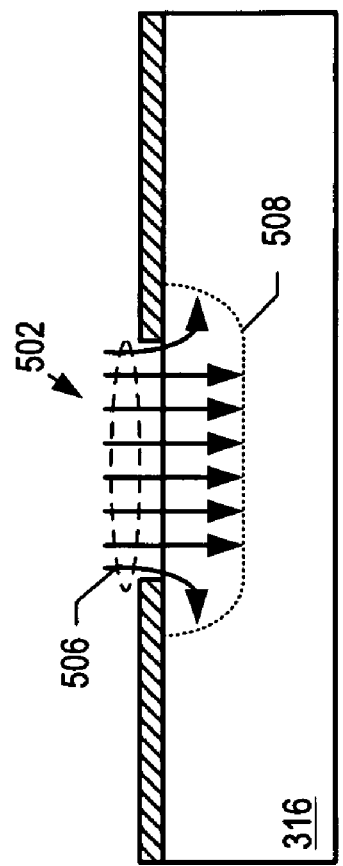
Figure 5C:
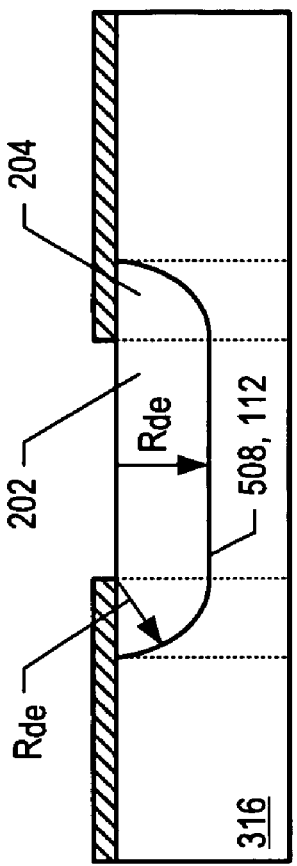

The operations that compose method 400 are best described in the context of a specific structure. To that end, the formation of cap layer 108, as depicted in FIG. 3B, will be described in conjunction with FIGS. 5A-C. FIGS. 5A-C depict cross-sectional views of cap layer 108 at various stages of fabrication.

At operation 401, a first mask-layer opening on a semiconductor layer is provided, as depicted in FIG. 5A. Referring to FIG. 5A, mask-layer opening 502 is formed in mask layer 504. Mask layer 504 is a 200 nm-thick film of silicon nitride deposited on semiconductor layer 316. Mask layer 504 is suitable for providing a diffusion barrier to p-type dopants. Mask-layer opening 502 is formed in mask layer 504 using conventional photolithography and reactive ion etching. Other suitable means for forming mask-layer opening 502 include wet-etching, ion milling, sputtering, and laser-assisted etching. It will be clear to those skilled in the art how to make and use mask-layer opening 502 and mask layer 504.

At operation 402, p-type dopant 506 is diffused into semiconductor layer 316 through mask-layer opening 502, as depicted in FIG. 5B. Suitable p-type dopants include, without limitation, zinc, cadmium, beryllium, and carbon. Referring now to FIG. 5B, dopant 506 diffuses both vertically and laterally into semiconductor layer 316, and forms diffusion front 508. The diffusion front in active region 202 forms as a planar front that progresses downward vertically into semiconductor layer 316. Lateral diffusion of dopant atoms at the edges of mask-layer opening 504, however, leads to the formation of edge region 204. The profile of diffusion front 508 in edge region is dictated by the classical diffusion equation.

In some embodiments, p-type dopant 506 is implanted into semiconductor layer 316 using ion-implantation. In some embodiments, ion-implantation is followed by a thermal treatment at an elevated temperature to drive the implanted dopant further into semiconductor layer 316.

Referring now to the completed structure depicted in FIG. 5C, diffusion front 508 and p-n junction 112 extend laterally past the edges of mask-layer opening 502 by the distance equal to diffusion radius $R_{de}$, thereby forming edge regions 204. In active region 202, the depth of p-n junction 112 is substantially equal to diffusion radius $R_{de}$.

In some embodiments, semiconductor layer 316 is a p-type semiconductor and dopant 506 is an n-type dopant. Suitable n-type dopants include, without limitation, sulfur and silicon.

Formation of a Cap Layer Using Multiple Diffusions

FIG. 6A depicts a cross-sectional view of a cap layer of a SAM-APD, formed using a double diffusion, according to the prior art. Cap layer 600 comprises semiconductor layer 602 and doped region 604.

Semiconductor layer 602 is a lightly n-doped layer of indium phosphide.

Doped region 604 is a heavily p-doped region within semiconductor layer 602, and forms p-n junction 606. Doped region 604 includes a planar junction region (i.e., an active region) having an active-region width and a non-planar junction region (i.e., an edge region) having an edge-region width.

Doped region 604 is formed using two diffusion operations and therefore includes two diffusion fronts, first diffusion front 608 and second diffusion front 610. The junction profile of p-n junction 606 is a function of both $R_{da}$ and $R_{de}$. $R_{de}$ is the diffusion radius of a first p-type dopant and $R_{da}$ is the diffusion radius of a second p-type dopant.

In the prior art, the edge-region width is often made quite wide to avoid premature edge breakdown near the active region. In addition, a wider edge region creates a more smoothly varying junction profile in the edge region and improves edge breakdown conditions.

FIG. 6B depicts a cross-sectional view of a cap layer of a SAM-APD, formed using a double diffusion, according to an embodiment of the present invention. Cap layer 612 comprises semiconductor layer 614 and doped region 616.

Semiconductor layer 602 is a lightly n-doped layer of indium phosphide having thickness $T_c$.

Doped region 616 is a heavily p-doped region within semiconductor layer 614, and forms p-n junction 618. Doped region 616 includes a planar junction region (i.e., active region 202) having active-region width 206 and a non-planar junction region (i.e., edge region 204) having edge-region width 208. Avalanche multiplication occurs in the high-electric field, undoped portion of active area 202.

In some embodiments, semiconductor layer 614 is an intrinsic semiconductor layer. In these embodiments, doped region 616 is doped with either an n-type dopant or a p-type dopant. In some embodiments, semiconductor layer 614 is a lightly p-doped semiconductor and doped region 616 is doped with an n-type dopant.

As will be described below and with respect to FIGS. 7 and 8A-D, doped region 616 is formed by two diffusions of a p-type dopant into semiconductor layer 614. First diffusion front 620 is a function of the diffusion radius, $R_{de}$, of a first dopant and the diffusion radius, $R_{da}$, of a second dopant. Second diffusion front 622 is at a distance equal to the diffusion radius, $R_{da}$, of a second dopant. The lateral extent of active region 202 is defined by the portion of second diffusion front which is at uniform depth (i.e., the planar junction region of p-n junction 618). The lateral extent of edge region 204 is defined by the outer portion of p-n junction 618 that is not at uniform depth. In order to provide a substantially minimum edge-region width while also maintaining suitable edge breakdown characteristics, edge-region width 208 is in the range of approximately $R_{de}+\frac{1}{2}R_{da}$ to $R_{de}+2R_{da}$. In some embodiments, edge-region width 208 is substantially equal to $R_{de}+R_{da}$.

In some embodiments, the first dopant is the same as the second dopant. In some embodiments, $R_{da}$ is equal to $R_{de}$. It will be noted by those skilled in the art that the lateral and vertical diffusion rates of a dopant in a semiconductor are sometimes not equal. For the purposes of this specification, however, $R_{da}$ and $R_{de}$ will be treated as uniform in the lateral and vertical directions.

Figure 7:
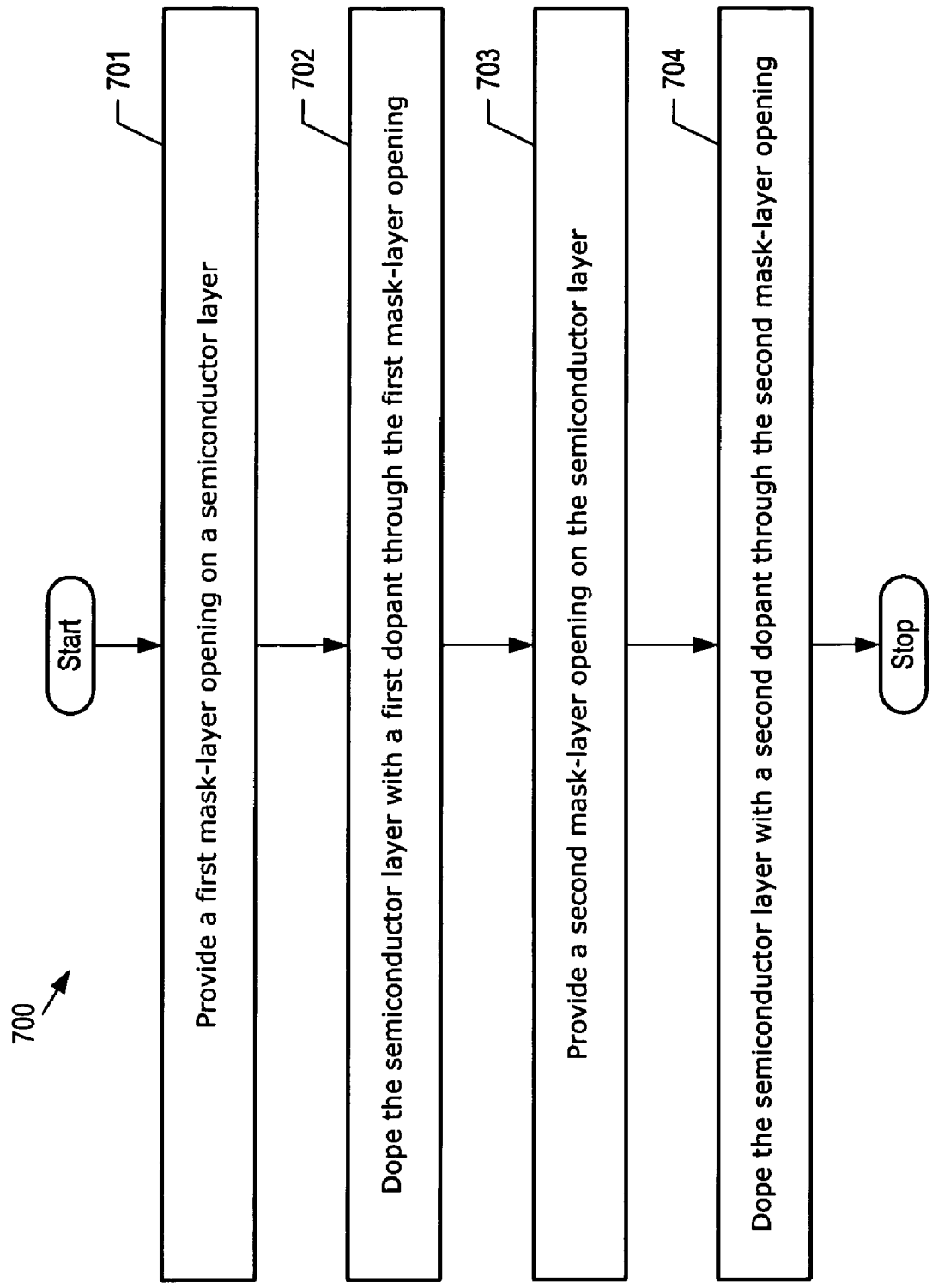
FIG. 7 depicts the salient components of a double diffusion method for fabricating the cap layer of a SAM-APD in accordance with an embodiment of the present invention.

FIG. 7 depicts the salient components of a double diffusion method for fabricating the cap layer of a SAM-APD in accordance with an embodiment of the present invention. In some embodiments, method 700 is used to form cap layer 612 shown in FIG. 6B.

The operations that compose method 700 are best described in the context of a specific structure. To that end, the formation of cap layer 612, as depicted in FIG. 6B, will be described in conjunction with the cross-sectional views of cap layer 800 at various stages of fabrication depicted in FIGS. 8A-D.

Figure 8A:
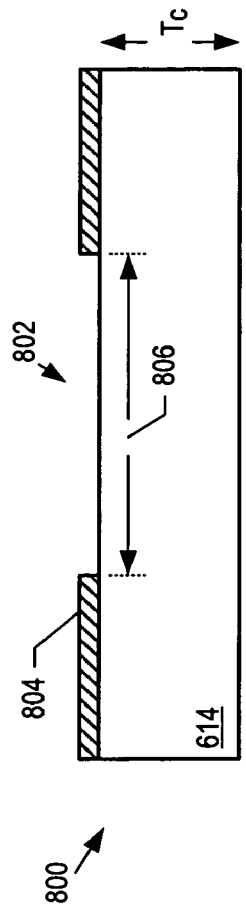
FIGS. 8A through 8D depict cross-sectional views of a cap layer during proceeding stages of fabrication, as fabricated in accordance with the operations depicted in FIG. 7.

At operation 701, a first mask-layer opening on a semiconductor layer is provided, as depicted in FIG. 8A. Referring to FIG. 8A, first mask-layer opening 802 is formed in first mask layer 804. The width of first mask-layer opening 802 is first mask-layer opening width 806. First mask layer 804 is a 200 nm-thick film of silicon nitride deposited on semiconductor layer 614, and is suitable for providing a diffusion barrier to p-type dopants. First mask-layer opening 802 is formed in first mask layer 804 using conventional photolithography and reactive ion etching. Other suitable means for forming first mask-layer opening 802 include wet-etching, ion milling, sputtering, and laser-assisted etching. It will be clear to those skilled in the art, after reading this specification, how to form and use first mask-layer opening 802.

Figure 8B:
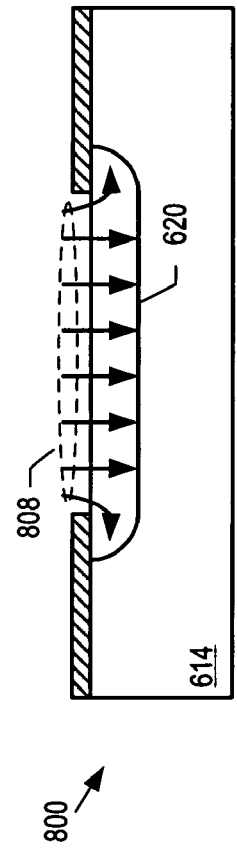

At operation 702, p-type dopant 808 is diffused into semiconductor layer 614 through mask-layer opening 802, thereby forming first diffusion front 620, as depicted in FIG. 8B. During operation 702, dopant 808 diffuses both laterally and vertically into semiconductor layer 614 as shown. Suitable p-type dopants include, without limitation, zinc, cadmium, beryllium, and carbon. In some embodiments, p-type dopant 808 is implanted into semiconductor layer 614 using ion-implantation. In some embodiments, ion-implantation is followed by a thermal treatment at an elevated temperature to drive dopant 808 further into semiconductor layer 614.

Figure 8C:
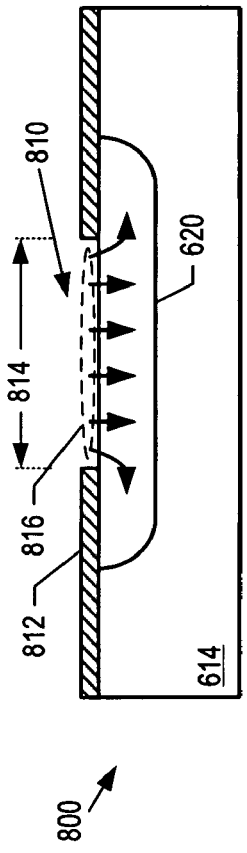

At operation 703, a second mask-layer opening on semiconductor layer 614, as depicted in FIG. 8C. Referring now to FIG. 8C, second mask-layer opening 810 is formed in second mask layer 812. Second mask-layer 812 is a 200 nm-thick film of silicon nitride, and is suitable for providing a diffusion barrier to p-type dopants. Second mask-layer opening 810 is smaller than first mask-layer opening 802 by an amount in the range of approximately $R_{da}$ to approximately $4R_{da}$. In some embodiments, second mask-layer opening 810 is smaller than first mask-layer opening 802 by approximately $2R_{da}$.

At operation 704, second p-type dopant 816 is diffused into semiconductor layer 614 through second mask-layer opening 810, thereby forming second diffusion front 622. Due to the heat associated with the diffusion of second p-type dopant 816, first diffusion front 620 progresses further into semiconductor layer 614 during operation 704. In some embodiments, operation 704 comprises the ion implantation of second dopant 816 into semiconductor layer 614. In some embodiments, ion-implantation is followed by a thermal treatment at an elevated temperature to drive dopant 816 into semiconductor layer 614 to diffusion radius $R_{da}$ and to drive dopant 808 into semiconductor layer 614 to diffusion radius $R_{de}$.

Figure 8D:
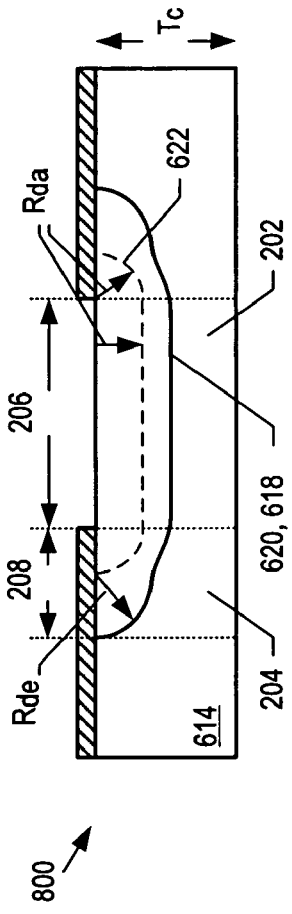

Referring now to the completed structure depicted in FIG. 8D, diffusion front 620 and p-n junction 618 extend laterally past the edges of second mask-layer opening 810 by a distance that is a function of diffusion radii $R_{da}$ and $R_{de}$, and thereby form edge regions 204. Edge-region width 208, therefore, is a function of $R_{da}$ and $R_{de}$, wherein edge-region width 208 is in the range of approximately $R_{de}+\frac{1}{2}R_{da}$ to approximately $R_{de}+2R_{da}$. In active region 202, the depth of p-n junction 618 is also a function of diffusion radii $R_{da}$ and $R_{de}$ and is in the range of approximately $0.5T_c$ to approximately $0.98T_c$.

In some embodiments, second mask-layer opening 810 and first mask-layer opening are both formed in first mask layer 804. In these embodiments, second mask-layer opening 810 is formed prior to first mask-layer opening 802.

In some embodiments, semiconductor layer 614 is a p-type semiconductor and first dopant 808 and second dopant 816 are n-type dopants. Suitable n-type dopants include, without limitation, sulfur and silicon.

It is to be understood that the above-described embodiments are merely illustrative of the present invention and that many variations of the above-described embodiments can be devised by those skilled in the art without departing from the scope of the invention. For example, in this Specification, numerous specific details are provided in order to provide a thorough description and understanding of the illustrative embodiments of the present invention. Those skilled in the art will recognize, however, that the invention can be practiced without one or more of those details, or with other methods, materials, components, etc.

Furthermore, in some instances, well-known structures, materials, or operations are not shown or described in detail to avoid obscuring aspects of the illustrative embodiments. It is understood that the various embodiments shown in the Figures are illustrative, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present invention, but not necessarily all embodiments. Consequently, the appearances of the phrase "in one embodiment," "in an embodiment," or "in some embodiments" in various places throughout the Specification are not necessarily all referring to the same embodiment. Furthermore, the particular features, structures, materials, or characteristics can be combined in any suitable manner in one or more embodiments. It is therefore intended that such variations be included within the scope of the following claims and their equivalents.

What is claimed is:

1. A photodiode comprising a semiconductor layer for providing avalanche multiplication of electrical carriers wherein the semiconductor layer comprises:
   (1) an active region having a substantially uniform breakdown voltage, $V_{ba}$, and wherein the active region is doped with a first dopant to a first diffusion radius, $R_{da}$, and wherein the active region is doped to a first junction depth that is substantially uniform; and
   (2) an edge region having an edge-region width, wherein the edge region is doped with a second dopant to a second diffusion radius, $R_{de}$, and wherein the edge region is doped to a second junction depth that has a second average junction depth, and wherein the edge-region width is within the range of approximately $R_{de}$ to approximately $R_{de}+2R_{da}$, and further wherein the edge region has a breakdown voltage, $V_{be}$, that is greater than or equal to $0.9V_{ba}$;
   wherein the active region and the edge region are contiguous, and wherein the first junction depth is greater than the second average junction depth.

2. The photodiode of claim 1 wherein the active region and the edge region have substantially the same doping level.

3. The photodiode of claim 1 wherein the edge-region width is substantially equal to $R_{da}+R_{de}$.

4. The photodiode of claim 1 wherein $V_{be}$ is greater than or equal to $0.99V_{ba}$.

5. The photodiode of claim 1 wherein the active region has an active-region width and the active-region width is less than or substantially equal to 1.25 times the mode-field diameter of an optical beam.

6. The photodiode of claim 1 wherein the active-region width is substantially equal to the mode-field diameter of the optical beam.

7. The photodiode of claim 1 wherein the first dopant and the second dopant are the same dopant.

8. The photodiode of claim 1 wherein the semiconductor has a thickness, $T_c$, and wherein the first junction depth is within the range of approximately $0.5T_c$ to $0.98T_c$.

9. The photodiode of claim 8 wherein the first junction depth is within the range of $0.75T_c$ to $0.9T_c$.

10. The photodiode of claim 9 wherein the first junction depth is approximately $0.8T_c$.

11. A single-photon avalanche photodiode comprising a semiconductor layer for providing avalanche multiplication of electrical carriers wherein the semiconductor layer comprises:
    (1) an active region having a substantially uniform breakdown voltage, $V_{ba}$, wherein the active region is doped with a first dopant to a first diffusion radius, $R_{da}$, and a second dopant to a second diffusion radius, $R_{de}$; and
    (2) an edge region having a breakdown voltage, $V_{be}$, that is greater than or equal to $0.9V_{ba}$, wherein a portion of the edge region is doped with the second dopant to a second diffusion radius, $R_{de}$, and wherein the edge region has an edge-region width that is within the range of approximately $R_{de}$ to approximately $R_{de}+2R_{da}$;
    wherein the active region and the edge region are contiguous, and wherein the active region and the edge region have substantially the same doping level.

12. The photodiode of claim 11 wherein the semiconductor layer has a thickness, $T_c$, and wherein the active region is characterized by a first junction depth that is substantially uniform and is within the range of approximately $0.5T_c$ to approximately $0.98T_c$, and wherein the edge region is characterized by a second junction depth that is non-uniform, and further wherein the second junction depth has an average junction depth that is less than the first junction depth.

13. The photodiode of claim 11 wherein the semiconductor layer has a thickness, $T_c$, and wherein the edge-region width is within the range of approximately $0.25T_c$ to approximately $2T_c$.

14. The photodiode of claim 13 wherein the edge-region width is in the range of substantially $0.5T_c$ to substantially $T_c$.

15. The photodiode of claim 11 wherein the semiconductor layer has a thickness, $T_c$, and wherein the active region has an active-region width that is in the range of substantially $0.25T_c$ to substantially $2T_c$.

16. The photodiode of claim 15 wherein the active region width is in the range of substantially $0.5T_c$ to substantially $T_c$.

17. The photodiode of claim 15 wherein the active-region width is substantially equal to $0.8T_c$.

18. A single-photon avalanche photodiode comprising a semiconductor layer for providing avalanche multiplication of electrical carriers wherein the semiconductor layer comprises a device region that is formed by operations comprising:
    doping the device region with a first dopant to a first diffusion radius, $R_{de}$, wherein the device region comprises an active region that is surrounded by an edge region; and
    doping the active region with a second dopant to a second diffusion radius, $R_{da}$;
    wherein the active region has a substantially uniform breakdown voltage, $V_{ba}$;

wherein the edge region has a breakdown voltage, $V_{be}$, that is greater than or equal to $0.99V_{ba}$;

wherein the edge region has an edge-region width that is within the range of approximately $R_{de}$ to approximately $R_{de}+2R_{da}$; and wherein the active region and the edge region are contiguous.

19. The photodiode of claim 18 wherein the active region and the edge region have substantially the same doping level.

20. The photodiode of claim 18 wherein the semiconductor layer has a thickness, $T_c$, and wherein the active region is characterized by a first junction depth that is substantially uniform and is within the range of 0.5Tc to approximately 0.98Tc, and wherein the edge region is characterized by a second junction depth that is non-uniform and has an average junction depth that is less than the first junction depth.

* * * * *